United States Patent
Kanda

(10) Patent No.: US 8,289,793 B2
(45) Date of Patent: Oct. 16, 2012

(54) NONVOLATILE SEMICONDUCTOR MEMORY DEVICE CAPABLE OF TESTING DIODES AND MANUFACTURING METHOD THEREOF

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 12/861,309

(22) Filed: Aug. 23, 2010

(65) Prior Publication Data

US 2011/0063887 A1    Mar. 17, 2011

(30) Foreign Application Priority Data

Sep. 17, 2009  (JP) .................................. 2009-216059

(51) Int. Cl.
*G11C 29/00* (2006.01)
(52) U.S. Cl. ...................................... 365/201; 365/105
(58) Field of Classification Search .................. 365/201, 365/105, 148, 158, 171; 714/718
See application file for complete search history.

(56) References Cited

U.S. PATENT DOCUMENTS 5,578,936 A    11/1996  Gibson et al.
8,059,447 B2 *  11/2011  Scheuerlein et al. .......... 365/148

FOREIGN PATENT DOCUMENTS

| JP | 2-266273 | 10/1990 |
| JP | 8-240639 | 9/1996 |
| JP | 2009-26867 | 2/2009 |

OTHER PUBLICATIONS

U.S. Appl. No. 12/884,694, filed Sep. 17, 2010, Kurosawa, et al.

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array, and a control circuit. The memory cell array includes plural memory cells arranged in rows and columns and each including a diode and resistance-change element. The control circuit tests the diodes for the respective memory cells. The control circuit tests the diode at least at one of times before and after one of a write operation, erase operation and read operation with respect to the memory cell is performed.

19 Claims, 12 Drawing Sheets

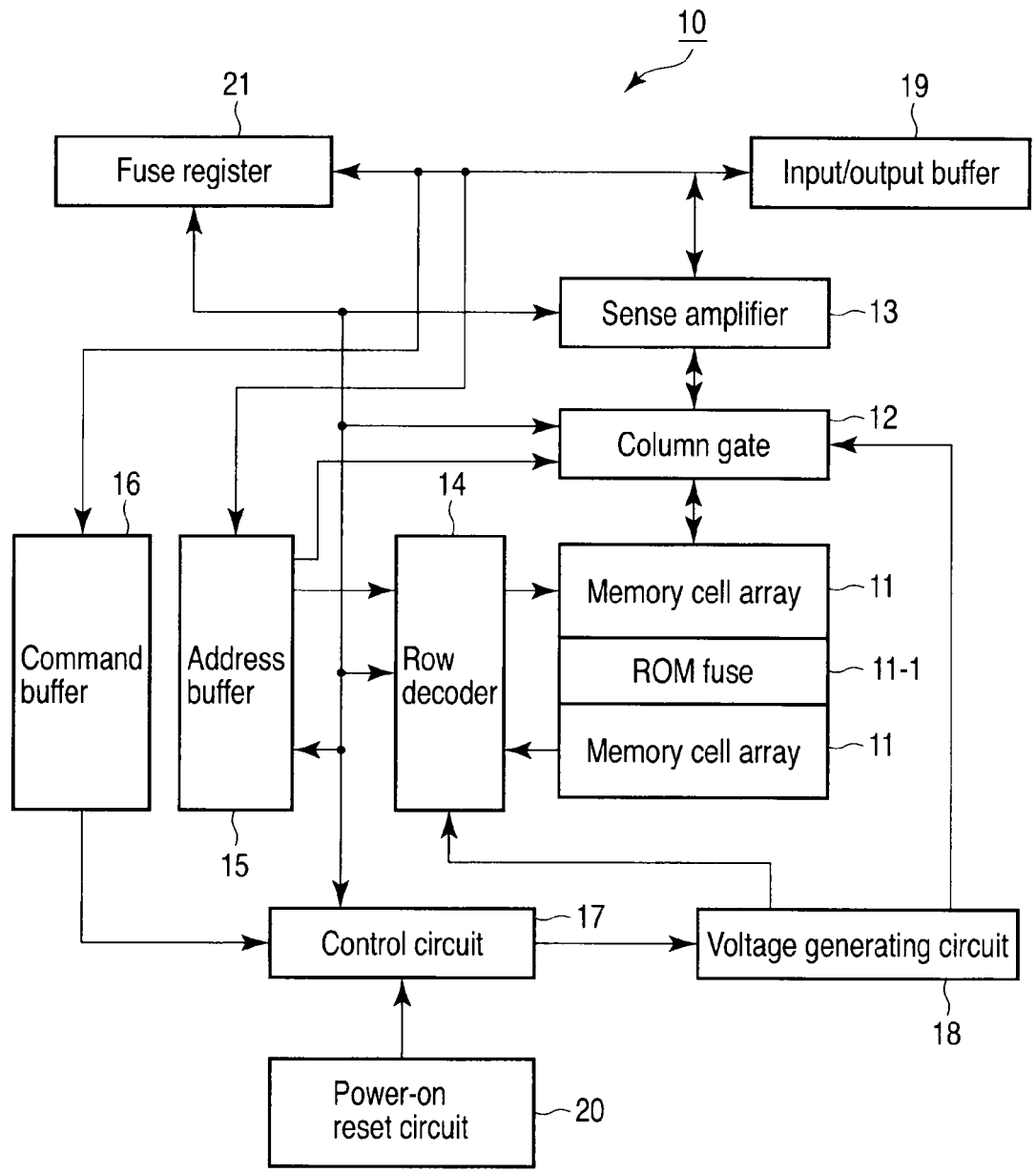
F I G. 1

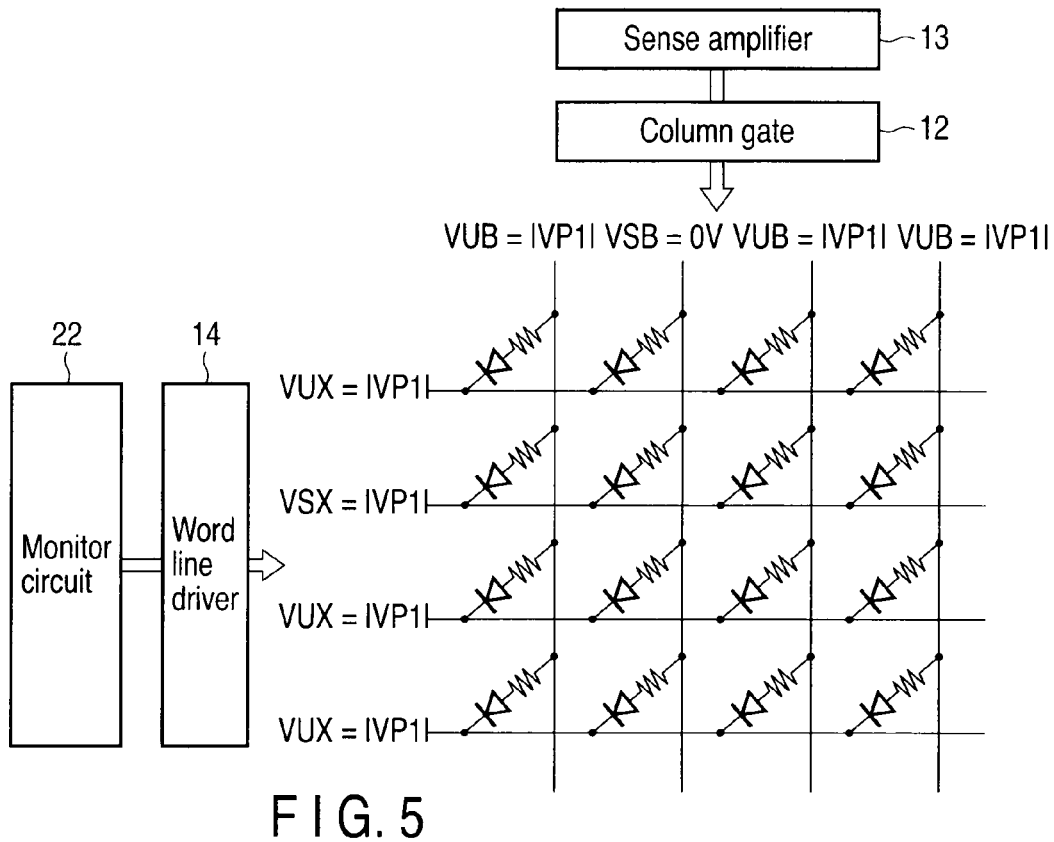
F I G. 5
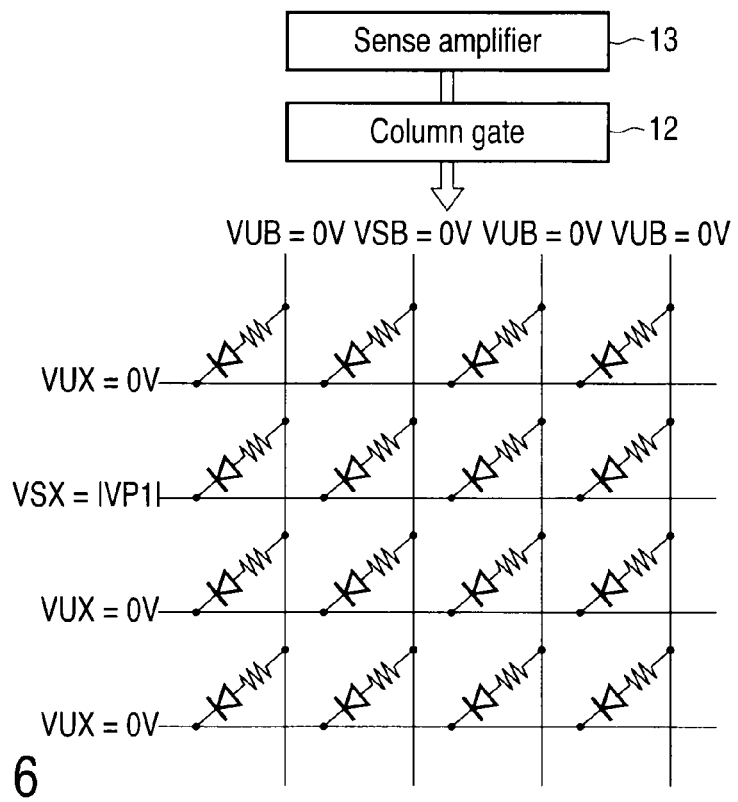
F I G. 6

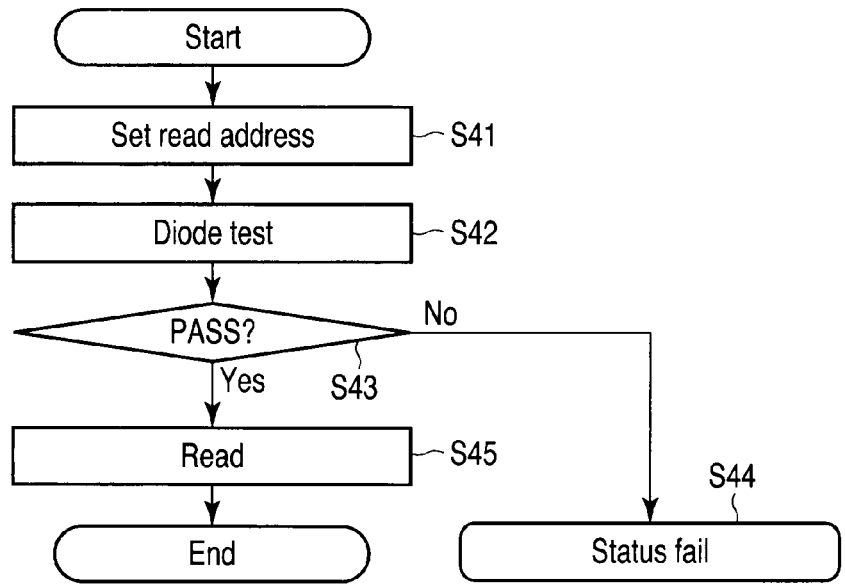
F I G. 11
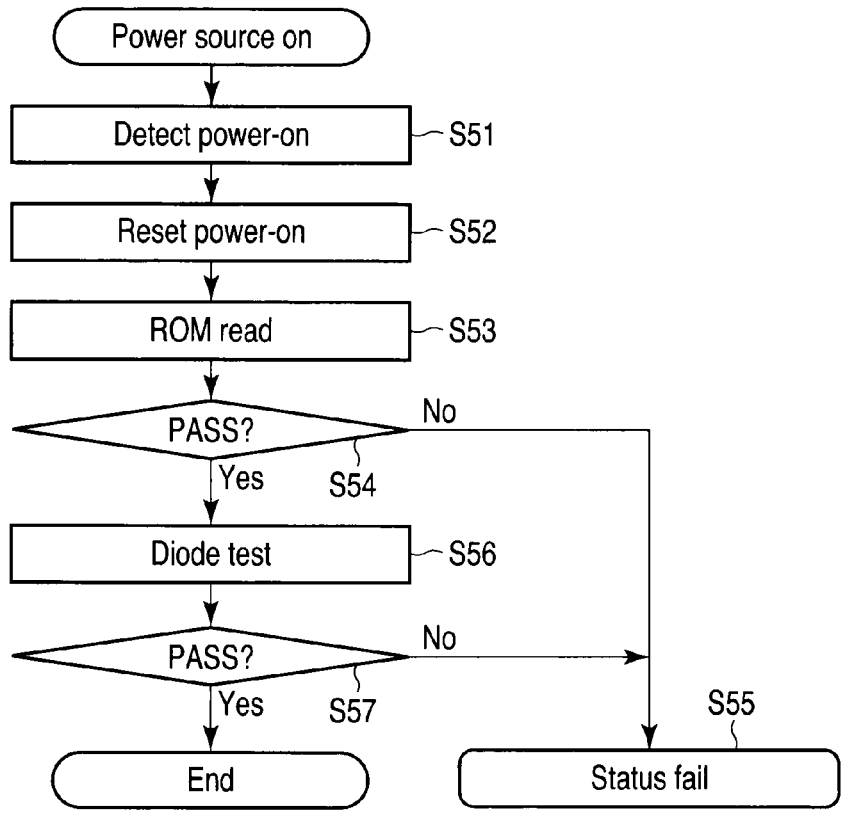
F I G. 12

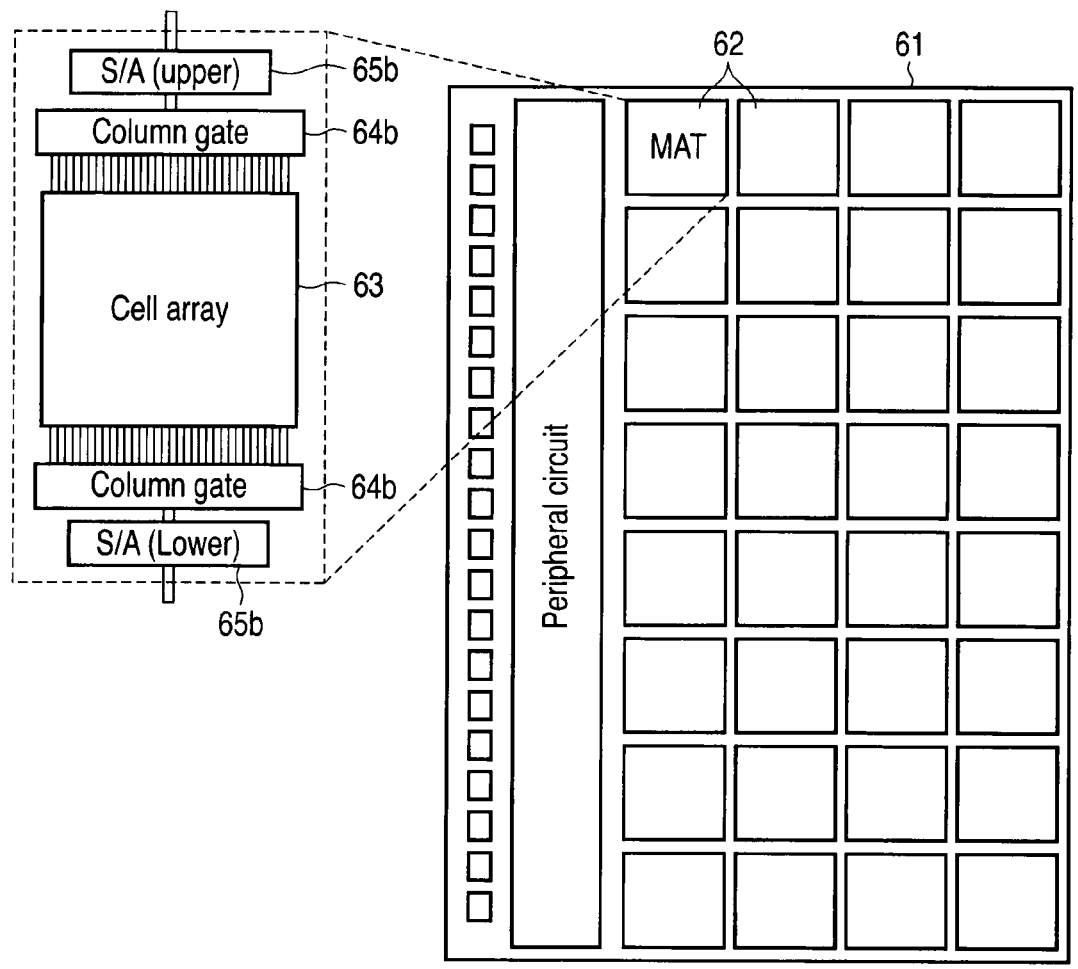
F I G. 13

NONVOLATILE SEMICONDUCTOR MEMORY DEVICE CAPABLE OF TESTING DIODES AND MANUFACTURING METHOD THEREOF

CROSS-REFERENCE TO RELATED APPLICATIONS

This application is based upon and claims the benefit of priority from Japanese Patent Application No. 2009-216059, filed Sep. 17, 2009; the entire contents of which are incorporated herein by reference.

FIELD

Embodiments described herein relate generally to a nonvolatile semiconductor memory device including a resistance-change memory having a diode and resistance-change element serially connected, for example, and a manufacturing method thereof.

BACKGROUND

Recently, a resistance-change memory utilizing an operation principle and resistance-change material other than those of a magnetoresistive random access memory (MRAM) and phase-change RAM (PRAM) is actively developed. Such the resistance-change memory is called a resistive RAM (ReRAM). As one of the resistance-change materials used for forming the ReRAM, a metal oxide is provided. The resistance-change element using the metal oxide includes a bipolar type element and non-polar type element. The polarities of a voltage and current required for transition between the low-resistance state and high-resistance state are different in the bipolar type element and both of the positive and negative polarities can be used in the non-polar type element. The memory operation of the non-polar type resistance-change element can be performed by use of the polarity of only one direction. Therefore, it is possible to configure a cross-point cell array in which cells each having a resistance-change element and diode serially connected are arranged in intersecting points between word lines and bit lines and operate the cells.

Further, since a resistance-change memory having a resistance-change element and diode serially connected is a two-terminal memory, the memory has a feature to be easily formed to have a 3-dimensional cell structure (for example, see Jpn. Pat. Appln. KOKAI Publication No. 2009-26867). Therefore, a two-layered structure formed by laminating two resistance-change memories, a four-layered structure formed by laminating four resistance-change memories and an eight-layered structure formed by laminating eight resistance-change memories can be attained.

The resistance of the resistance-change memory significantly varies between binary digits "0" and "1". Specifically, the ratio of the resistances of "0" and "1" varies according to the material and is set to vary by several figures to attain a certain signal-to-noise ratio. Therefore, a current in the resistance-change memory greatly varies after the write operation and after the erase operation.

Further, the resistance-change memory is connected to each intersecting point between the bit line and word line and the resistance-change element and diode configuring the resistance-change memory share voltage VBL (for example, 3 V) applied from a bit line driver and voltage VWL (for example, zero) applied from a word line driver. Therefore, the ratio of voltages applied to the resistance-change memory is abruptly changed according to the write or erase state of the resistance-change memory. As an influence caused by this, there occurs a possibility that a current abruptly flows into the resistance-change memory when the resistance-change memory is changed from the high-resistance state to the low-resistance state.

Further, an attempt is made to increase the capacity of the resistance-change memory, miniaturize the same and reduce the cost thereof. Therefore, it is important that the resistance-change memory may have a bright future for scaling. Further, since the data input/output time is more delayed as the capacity is more increased, it is required to increase the operation speed. However, since the elements are made smaller as the memory is more miniaturized to increase the capacity, there occurs a problem that a current cannot be increased. In order to realize the high-speed operation, it is necessary to pass a larger current through the memory cell. In this case, the current value for each cross-sectional area of the element is increased. Further, if the cell array is large, the interconnection capacitances and interconnection resistances of the bit lines and word lines increase and a current caused by a component that cannot be controlled by a driver also increases although it depends on the structure of the cell array.

Thus, under the situation in which an excessively large current may flow in the cell, the performance required for the diode is attained by a structure with a withstand voltage that is highly resistive to the excessively large current. Further, in the bit line driver and word line driver, a current-limiting mechanism is provided and a measure for suppressing an excessively large current is taken. However, even if such a measure is taken, weak cells may be formed due to a variation in the manufacturing process and diodes may be destroyed. As a result, it becomes necessary to detect the destroyed diode without fail and eliminate the defective diode. Therefore, it is desired to develop a nonvolatile semiconductor memory device capable of detecting the destroyed diode without fail and a manufacturing method thereof.

BRIEF DESCRIPTION OF THE DRAWINGS

FIG. 1 is a configuration diagram showing a nonvolatile semiconductor memory device utilizing a resistance-change memory to which an embodiment is applied.

FIG. 5 is a diagram showing another example of the diode test and showing the relationship of potentials at the test time.

FIG. 6 is a diagram showing still another example of the diode test and showing the relationship of potentials at the test time.

FIG. 11 is a flowchart showing a fourth modification of the first embodiment.

FIG. 12 is a flowchart showing a second embodiment.

FIG. 13 is a diagram showing an array structure to which a resistance-change memory is applied.

DETAILED DESCRIPTION

Figure 2:
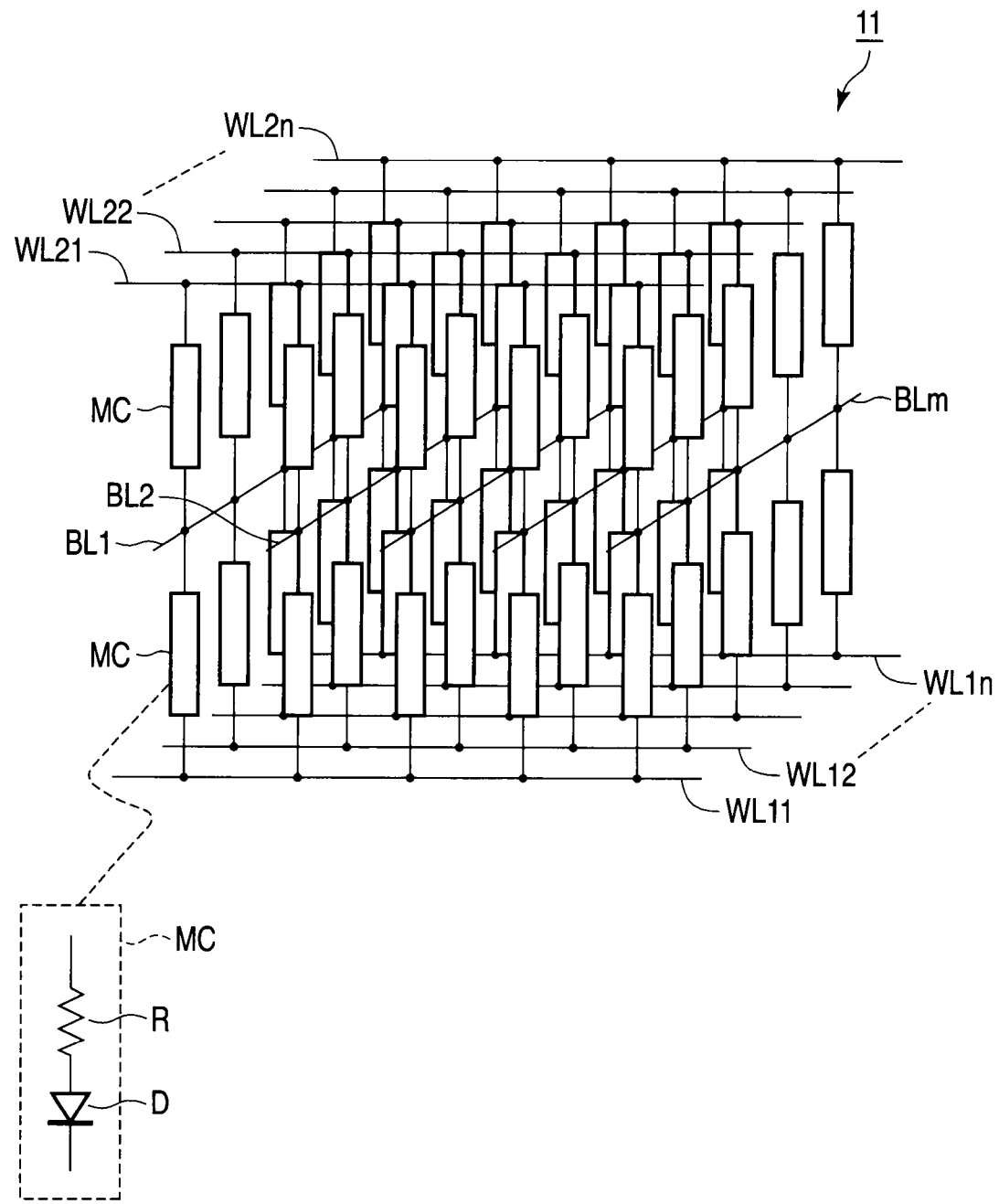
FIG. 2 is a circuit diagram showing one example of a memory cell array and memory cell shown in FIG. 1.

In general, according to one embodiment, a nonvolatile semiconductor memory device includes a memory cell array, and a control circuit. The memory cell array includes plural memory cells each configured by a diode and resistance-change element and arranged in rows and columns. The control circuit tests the diode for each memory cell. The control circuit tests the diode at least before or after one of the write operation, erase operation and read operation with respect to the memory cell is performed.

Next, an embodiment is explained with reference to the accompanying drawings.

For example, a nonvolatile semiconductor memory device 10 shown in FIG. 1 includes a memory cell array 11, column gate 12, sense amplifier 13, row decoder 14, address buffer 15, command buffer 16, control circuit 17, voltage generating circuit 18, input/output buffer 19, power-on reset circuit 20 and fuse register 21.

The memory cell array 11 includes a ROM fuse 11-1. As will be described later, the ROM fuse 11-1 stores redundancy information and adequate voltage setting information.

The input/output buffer 19 receives and holds data such as a command and address via a data bus. The address buffer 15 receives an address supplied from the input/output buffer 19 and supplies the address to the column gate 12 and row decoder 14. The column gate 12 and row decoder 14 select a bit line and word line of the memory cell array according to the address.

The command buffer 16 receives a command supplied from the input/output buffer 19. The control circuit 17 generates a control signal based on the command received by the command buffer 16. The voltage generating circuit 18 generates a voltage required for the write operation, erase operation, read operation and the like as the basic operation of the cell based on the control signal of the control circuit 17.

The power-on reset circuit 20 performs an initializing operation required for the operation of the nonvolatile semiconductor memory device 10 at the power-on time. The fuse register 21 stores setting information required for the operation of the nonvolatile semiconductor memory device 10.

FIG. 2 shows the configuration of the memory cell array 11 of FIG. 1. The memory cell array 11 is formed with a two-layered structure having two resistance-change memories (that may be hereinafter simply referred to as memory cells MC), for example. The memory cells MC are arranged in intersecting points between common bit lines BL1 to BLm and word lines WL11 to WL1$n$ and word lines WL21 to WL2$n$. Further, each memory cell MC is configured by a series circuit of a resistance-change element R and diode D.

First Embodiment

Figures 3A, 3B:
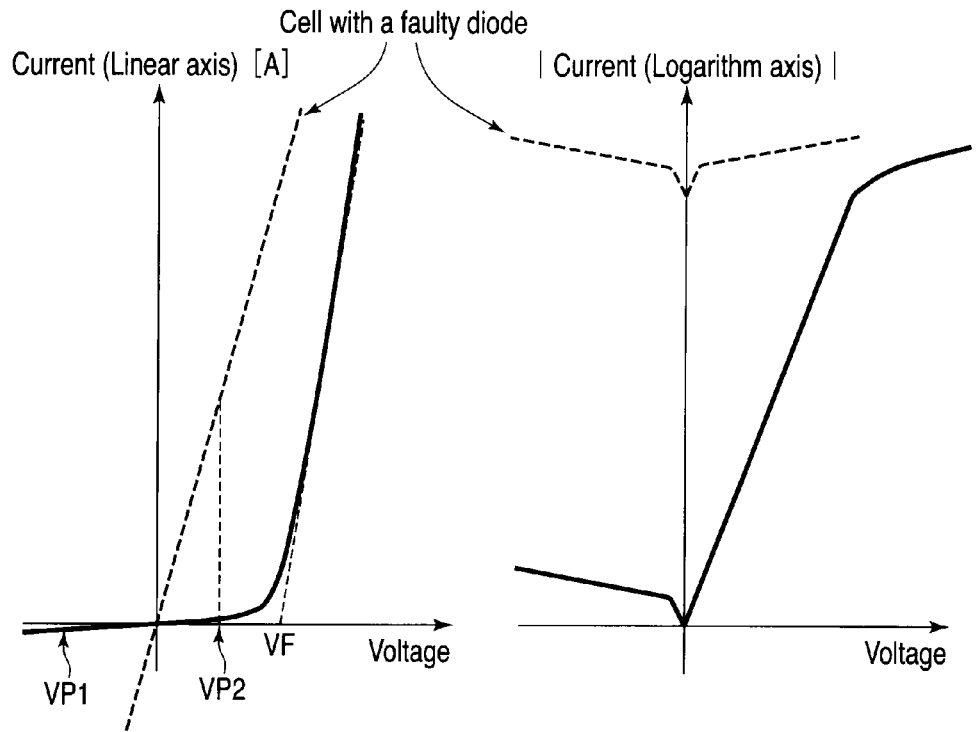
FIGS. 3A and 3B are diagrams showing diode characteristics.

FIGS. 3A and 3B show the I-V characteristics of a normal diode and defective diode. FIG. 3B shows the characteristic of FIG. 3A by use of a logarithm scale.

Generally, as shown by solid lines in FIGS. 3A and 3B, the characteristic of the normal diode indicates that an extremely small leak current of approximately several pA flows at a reverse bias application time, a rectification characteristic is indicated at a forward bias application time and a current exponentially increases as the voltage is raised. Generally, a region near the forward voltage VF (=approximately 0.7V) of the diode is set as a boundary, a region of 0 to VF is a infinitesimal leak current region and a large current flows in a region higher than or equal to VF.

On the other hand, as shown by broken lines in FIGS. 3A and 3B, it is supposed that the characteristic of the destroyed diode does not indicate the rectification characteristic and indicates an ohmic characteristic. Therefore, the test of the diode can be made to determine whether the diode is normal or defective by detecting a current flowing when voltage VP1 (negative voltage) or VP2 shown in FIG. 3A is applied to the memory cell. That is, a current flowing in the memory cell when voltage VP1 or VP2 is applied to the cell is detected by means of the sense amplifier, and the diode state can be determined to be defective or normal if the detected current is larger or less than a preset specified value. The test is hereinafter referred to as a diode test.

Figure 4:
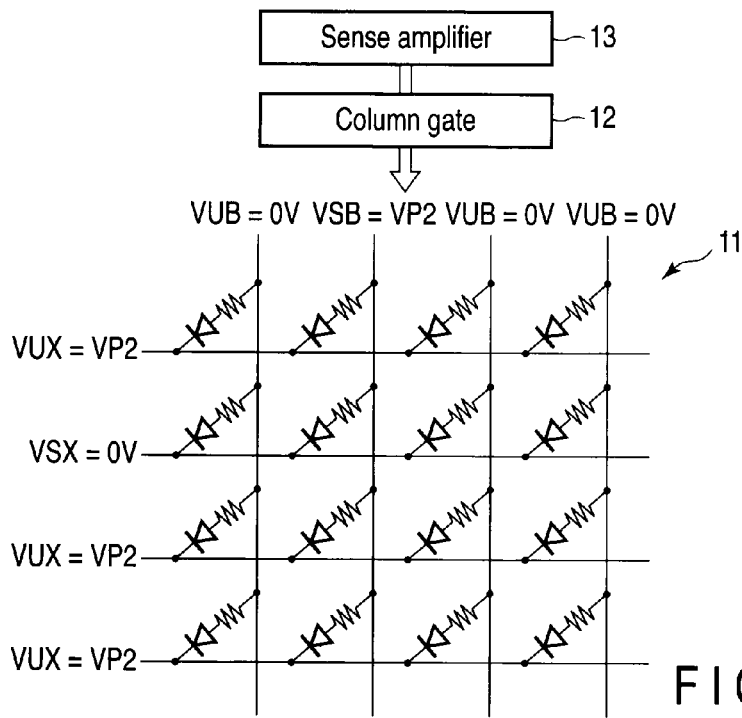
FIG. 4 is a diagram showing one example of a diode test and showing the relationship of potentials at the test time.

FIGS. 4 to 6 show the relationships of potentials in the diode tests. FIG. 4 shows potentials at the diode test time by use of voltage VP2 shown in FIG. 3A, and FIGS. 5 and 6 show potentials at the diode test time by use of voltage VP1 shown in FIG. 3A. However, voltage VP1 shown in FIG. 3A is a negative voltage, but is set to a relatively negative voltage by setting the voltage on the word line side higher than the voltage on the bit line side as shown in FIGS. 5 and 6.

In the diode test case by use of the forward bias shown in FIG. 4, voltage VSB of the selected bit line is set to VP2 and voltage VUB of the unselected bit line is set to zero. Further, voltage VSX of the selected word line is set to zero and voltage VUX of the unselected word line is set to VP2. In this state, a current flowing in the selected cell is detected by means of the sense amplifier 13 via the column gate 12.

In the diode test case by use of the reverse bias shown in FIG. 5, voltage VSB of the selected bit line is set to zero and voltage VUB of the unselected bit line is set to |VP1|. Further, voltage VSX of the selected word line is set to |VP1| and voltage VUX of the unselected word line is also set to |VP1|. That is, the potential relationship is set to VSX=VUX=VUB=|VP1|, and potentials of the word lines and bit lines are set to permit a current to flow only in the cell connected to interconnections used to monitor the current, that is, the selected word line and selected bit line and prevent currents from flowing in the other cells. In this state, a current flowing in the selected cell is detected by means of the monitor circuit 22 via the word line driver 14. For example, the monitor circuit 22 is provided in a testing device (not shown) and is connected to the word line driver 14 at the diode test time.

In the diode test case by use of the reverse bias shown in FIG. 6, voltage VSB of the selected bit line is set to zero and voltage VUB of the unselected bit line is also set to zero. Further, voltage VSX of the selected word line is set to |VP1| and voltage VUX of the unselected word line is set to zero. That is, the potential relationship is set to VSB=VUX=VUB=0 V, and potentials of the word lines and bit lines are set to permit a current to flow only in the cell connected to interconnections used to monitor the current, that is, the selected word line and selected bit line and prevent currents from flowing in the other cells. In this state, a current flowing in the selected cell is detected by means of the sense amplifier 13 via the column gate 12.

In each diode test, voltage VP1 is determined as follows. A current flowing in the normal cell in response to a voltage of −1 to 0 V is less than or equal to several pA although it depends on the diode characteristic. Therefore, it is difficult to monitor the current. Thus, voltage |VP1| is set to +2 V, for example, as a level that is not a high voltage while permitting a current of several pA or more to flow.

Further, voltage VP2 is set between zero and VF (0.7 V), but there occurs a possibility that an error occurs in forward voltage VF depending on the diode characteristic. Therefore, voltage VP2 is set to VF/2, for example.

Figure 7:
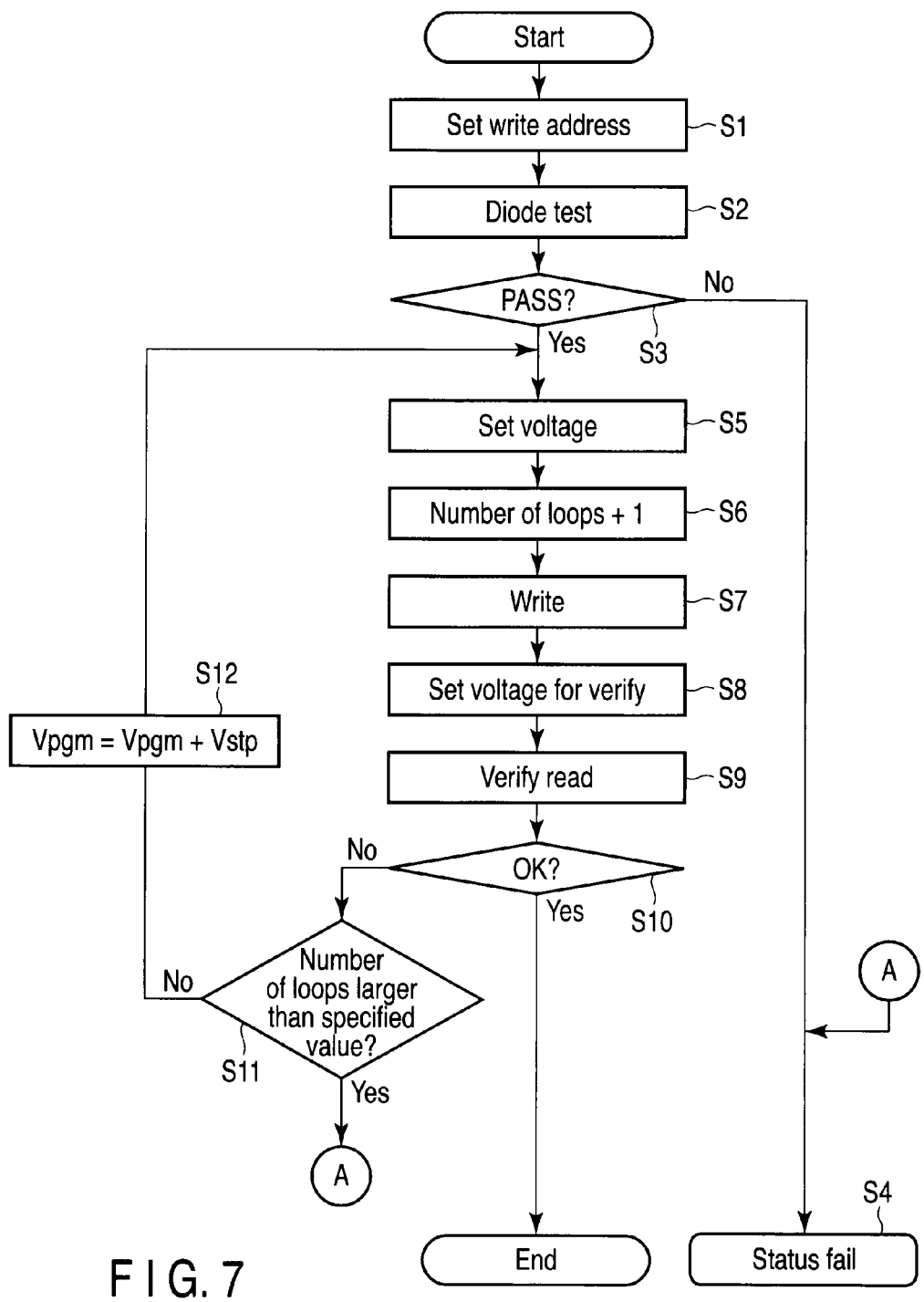
FIG. 7 is a flowchart showing a first embodiment.

FIG. 7 shows a first embodiment. The first embodiment shows an operation sequence having a diode test incorporated in a die sort test, for example, contained in the manufacturing process of a nonvolatile semiconductor memory device.

As shown in FIG. 7, when a write command is input to the nonvolatile semiconductor memory device, a write sequence is started and a write address and write voltage are set (S1). In the case of a normal die sort test, a write operation is performed in this state. However, in the case of the first embodiment, the diode test is made (S2) before the write operation is performed.

The diode test is made by use of at least one of the potential relationships shown in FIGS. 4 to 6. After this, the result of the diode test is determined (S3). In the case of a fail indicating that the diode is detected to be defective as the determination result, status data is processed as a fail and information indicating that the cell is a defective cell in which data cannot be written is supplied to the external (S4).

Further, if a defective diode is not detected, that is, if it is detected that the diode test is passed as the determination result of step S3, a write voltage is set (S5) and a write operation with respect to the memory cell is performed. That is, the number of loops is incremented (S6) and then the write operation is performed (S7).

Subsequently, a verification voltage used to determine whether the write operation has been performed or not is set (S8) and a verification read operation is performed (S9). Next, whether the write operation is sufficiently performed or not is determined as the result of verification (S10). That is, whether the resistance of the resistance-change element is sufficiently high or not is determined based on a current flowing in the resistance-change memory. If the write operation is not sufficiently performed, it is determined whether or not the number of loops (the number of write operations) is within a specified value (S11). If the number of loops is within the specified value, write voltage Vpgm is increased by voltage Vstp (S12) and the write operation is performed again.

Further, if it is determined in step S10 that the write operation is sufficiently performed, the diode is determined to normal and the write operation is normally terminated. Further, if it is detected in step S11 that the number of loops has reached the specified value, it is determined that the write operation is performed in failure (S4).

According to the first embodiment, it is detected that the diode configuring the resistance-change memory is faulty by executing a diode test to the resistance-change memory at the write operation time of the die sort test. Therefore, a defective diode occurring at the manufacturing time of a nonvolatile semiconductor memory device can be detected without fail and it is possible to enhance the reliability of the nonvolatile semiconductor memory device by eliminating the defective diode.

First Modification of First Embodiment

Figure 8:
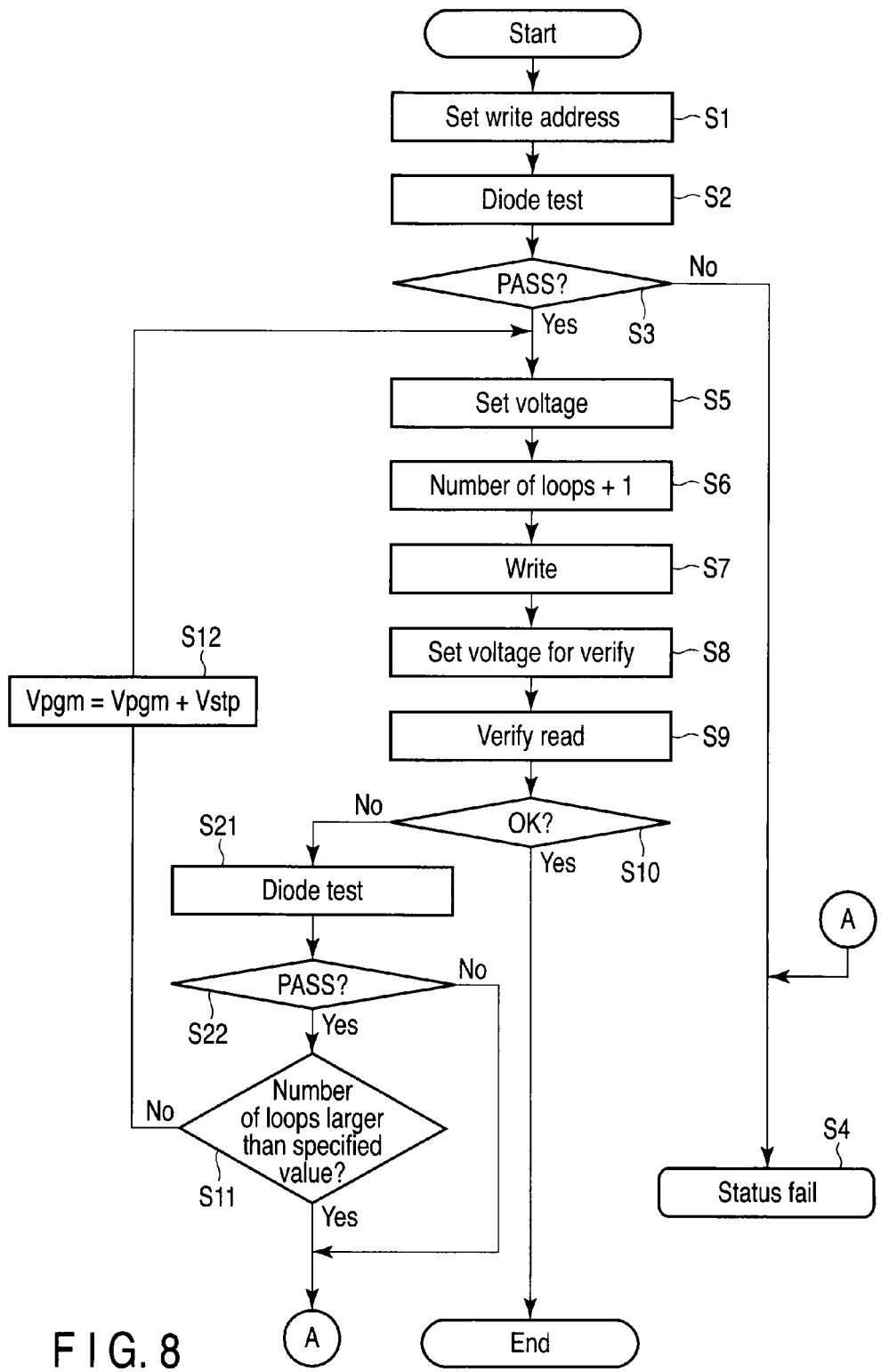
FIG. 8 is a flowchart showing a first modification of the first embodiment.

FIG. 8 shows a first modification of the first embodiment. In FIG. 8, portions that are the same as those of FIG. 7 are denoted by the same reference symbols and only different portions are explained. In the following embodiments and modifications, the same portions are denoted by the same reference symbols.

In the first embodiment, the diode test is made only before the write operation of the resistance-change memory. In this case, if the diode is broken in the write operation after the diode test, it is impossible to detect a defective diode.

Therefore, in the first modification, the diode test is made again after termination of the write operation to check whether the diode is normal or not. That is, in the write sequence, the diode test is made each time the write operation is performed.

That is, in FIG. 8, for example, if the write operation is not sufficiently performed after the verification read operation (S9) and determination process (S10), a diode test (S21) is made. The diode test is made like the diode test in step S2. After the diode test, it is determined whether the result of the diode test indicates a pass or fail (S22). In the case of a fail, the write sequence is terminated, status data is set to a fail and information indicating that the cell is a faulty cell in which data cannot be written is supplied to the external (S4).

Further, if the diode test is passed and when the number of loops is within a specified value (S11), a program voltage is stepped up (S12) and the write operation is performed again.

According to the first modification, the diode test is also made after the write operation by the die sort test was performed. Therefore, if the diode is destroyed in the write operation, the destroyed diode can be detected. Thus, a defective diode can be screened before shipment and the reliability of the nonvolatile semiconductor memory device can be further enhanced.

Second Modification of First Embodiment

Figure 9:
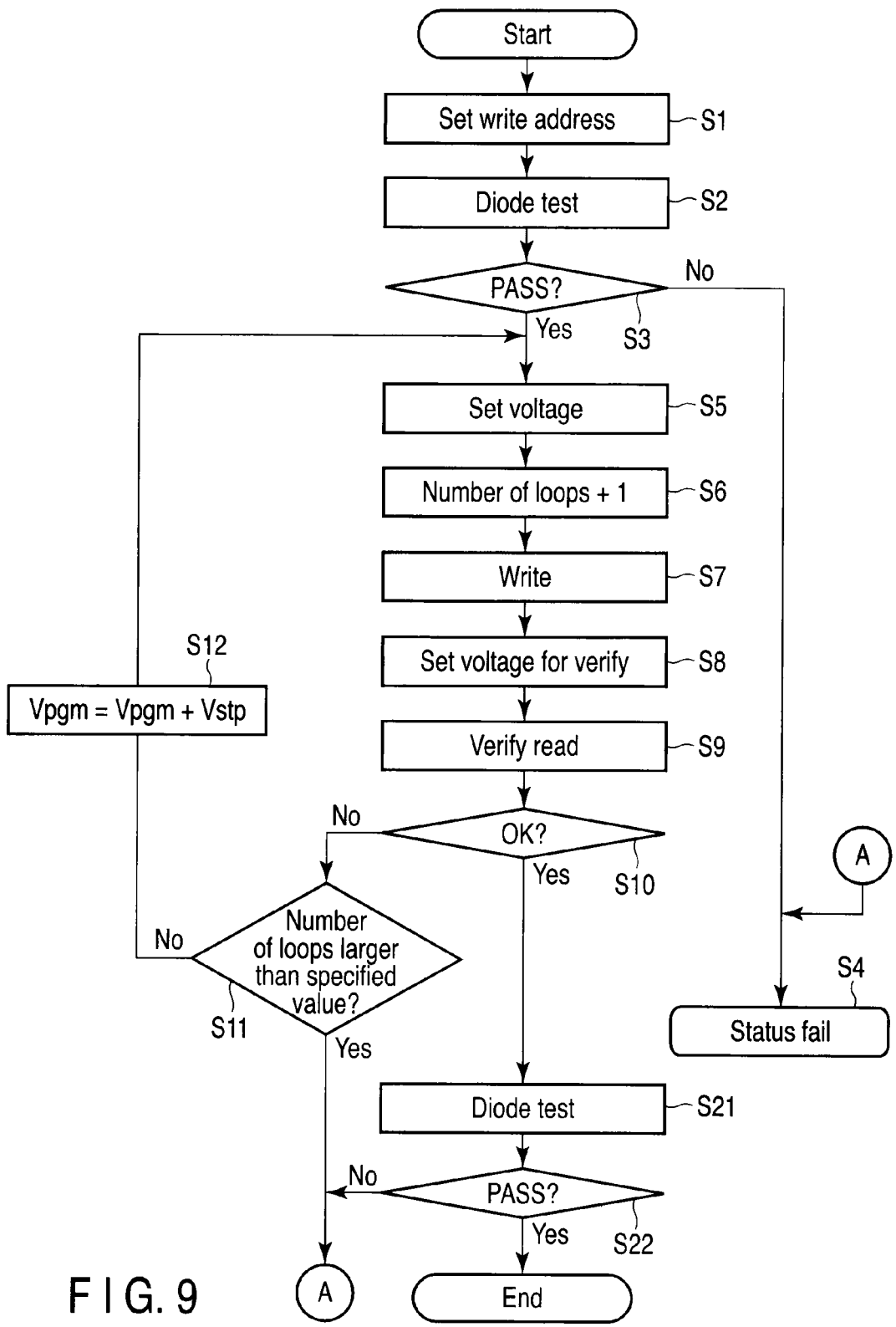
FIG. 9 is a flowchart showing a second modification of the first embodiment.

FIG. 9 shows a second modification of the first embodiment.

In the first modification, the diode test is made each time the write operation is performed in the write loop. Therefore, the time required for testing the nonvolatile semiconductor memory device becomes long.

Therefore, in the second modification, the diode test is not made each time the write operation is performed but the diode test is made before the write operation and after termination of the write operation.

That is, as shown in FIG. 9, if it is detected as the verification result in step S10 that the write operation is normally terminated, the diode test is made (S21). As a result, the write operation and the diode test are terminated if the test result indicates a pass and status data is transmitted as a fail to the external (S4) if the test result indicates a fail.

According to the second modification, the diode test after the write operation is made not in the write loop but outside the write loop. Thus, since the diode test is not made for each write operation, the test time for the nonvolatile semiconductor memory device can be reduced.

Third Modification of First Embodiment

In the first embodiment and the first and second modifications, a case wherein the diode test is made in the write operation is explained. However, a diode may be destroyed not only in the write operation but also in the erase operation of the memory cell.

Figure 10:
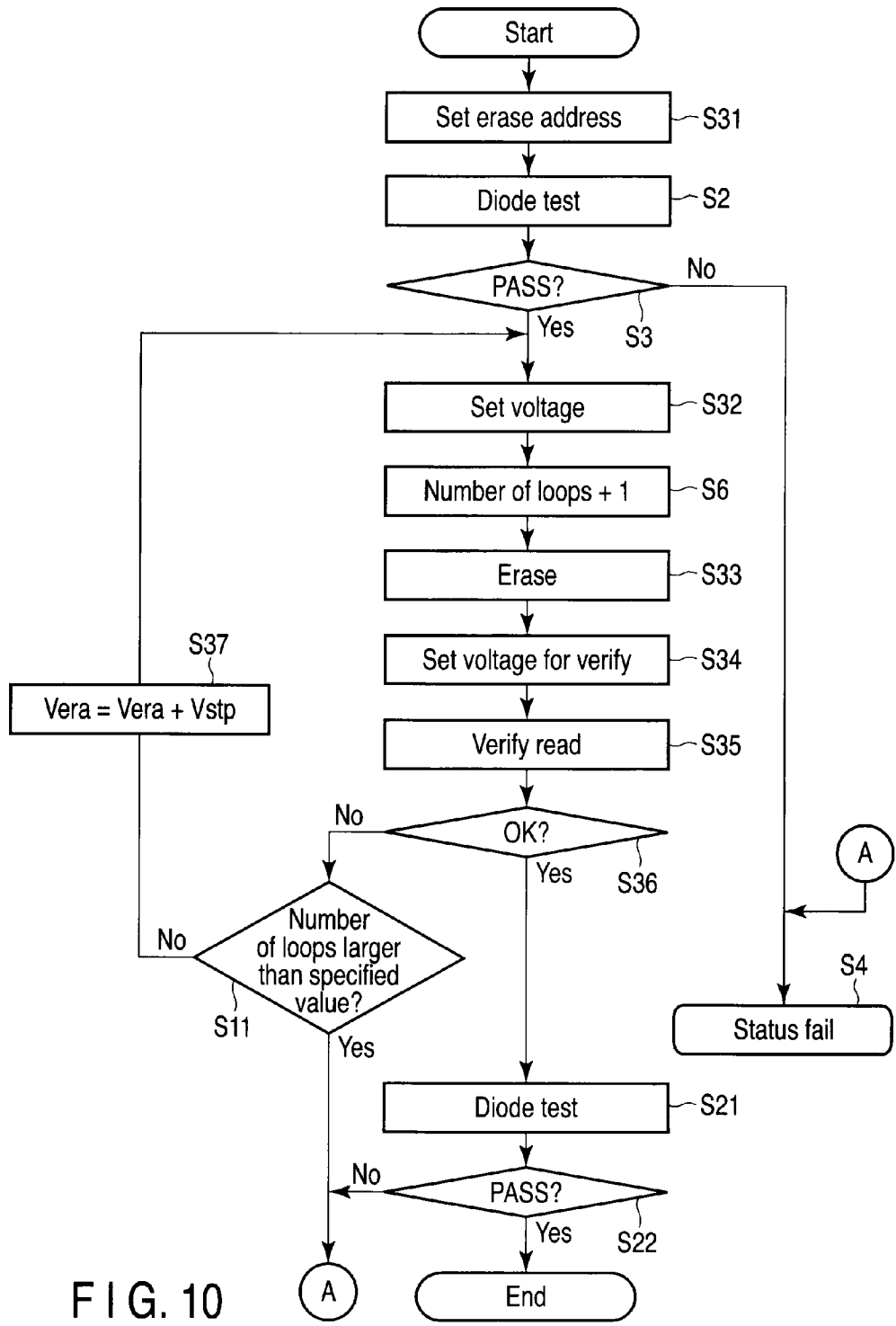
FIG. 10 is a flowchart showing a third modification of the first embodiment.

Therefore, in the third modification shown in FIG. 10, a case wherein the diode test is made in the erase operation is explained. FIG. 10 is a modification obtained by modifying the modification of FIG. 9 and steps S31, S32, S33 to S36, S37 relating to the erase operation are set to correspond to steps S1, S5, S7 to S10, S12 relating to the write operation of FIG. 9. That is, in step S31, an erase address is set. Then, the diode test of step S2 is made and the test result is determined (S3). Subsequently, an erase voltage is set (S32), the number of loops is incremented and the erase operation is performed (S33). After this, an erase verification voltage is set (S34) and an erase verification read operation is performed (S35). Next, whether or not the erase operation is sufficiently performed is determined (S36). Then, whether or not the number of loops is set within a specified value is determined (S11) if the erase operation is insufficient. If it is determined that the number of loops is within the specified value as the result of this, erase voltage Vere is stepped up by voltage Vstp (S37) and the erase operation is performed again. If the above operation is repeatedly performed and the erase operation is sufficiently performed, the diode test is made and the test result is determined in steps S21, S22.

According to the third modification, the diode test is made together with the erase operation. Therefore, a defective diode occurring can be detected in the erase operation without fail and the reliability of the nonvolatile semiconductor memory device can be enhanced.

Fourth Modification of First Embodiment

FIG. 11 shows a sequence in which a diode test is applied to the read operation. In the read operation, basically, a high voltage is not applied to a memory cell and a large current hardly flows in the memory cell. Therefore, it is considered that a fault scarcely occurs in the diode at the read time. Thus, a diode test (S41) and test result determination step (S42) are provided only before the read operation (S45). That is, the diode test is made and the test result determination operation is performed after a read address is set (S41).

According to the fourth modification, the diode test is made and the test result determination operation is performed in the read operation. Therefore, occurrence of a defective diode can be detected without fail in the read operation and the reliability of the nonvolatile semiconductor memory device can be enhanced.

Second Embodiment

FIG. 12 shows a second embodiment and shows a power-on sequence on the assumption that the read operation of the ROM fuse 11-1 shown in FIG. 1 is performed.

In a nonvolatile semiconductor memory device, redundancy information used to replace a faulty cell by a redundant cell in the memory cell array and optimum voltage setting information for each chip are stored in the ROM fuse 11-1. The above information items are read from the ROM fuse 11-1 at the power-on time and the chip is set in an optimum state. The operation is called a ROM read operation. After termination of the ROM read operation, it is necessary to perform a test to determine whether a defective diode occurs or not. Therefore, in the second embodiment, a diode test is made for each time after the ROM read operation to check whether a fault occurs in the diode or not.

That is, in FIG. 12, if it is detected that the power source of the chip is turned on (S51), a power-on reset circuit 20 is activated (S52) and data stored in the ROM fuse 11-1 is read to initialize the chip (S53). Then, whether the ROM read operation has been correctly performed or not is determined (S54). If it is determined that the ROM read operation is not correctly performed as the result of this, this is notified to the external as a status fail (S55).

Further, if the ROM read operation has been correctly performed, a diode test is made (S56). If a fault is detected in the diode as the result of this, status data is set to a fail and notified to the external. If a defective diode is not detected, the process proceeds to the next step.

According to the second embodiment, data of the ROM fuse 11-1 is read after the power source is turned on and then the diode test is made to detect a diode fault. Therefore, if the diode is detected to be faulty at the read time of the ROM fuse 11-1, for example, marking for a bad cell is made and an area in which the fault is present can be set as a faulty block. Alternatively, a memory cell including the defective diode can be replaced by a redundant cell based on a redundancy replacement function and the device can be used as a good product.

Further, a function of the diode test can be incorporated in the chip. In this case, a memory cell including a defective diode can be replaced by a redundant cell based on a redundancy replacement function provided in a control circuit 20 in a case where the defective diode is detected after the power source is turned on and when the user uses the memory device.

Third Embodiment

FIG. 13 shows an array structure to which a resistance-change memory is applied. As described before, a current flowing in the resistance-change memory is greatly varies. Therefore, the current amount for each cell is large. Further, it is necessary to simultaneously access a large number of cells by one access in order to increase the cell access speed with an increase in the capacity. Therefore, a current drawn therein becomes extremely large in the whole chip. However, there occurs a large difference in potential drops due to parasitic resistances of interconnections when access is made to a large number of closely arranged cells and when access is made to a large number of dispersedly arranged cells. That is, when access is made to a large number of closely arranged cells, currents flowing in the interconnections leading to the accessed cells are concentrated. Further, when access is made to a large number of dispersedly arranged cells, currents flowing in the interconnections leading to the accessed cells are dispersed. The potential drop caused by the parasitic resistance of the interconnection becomes smaller when the currents flowing in the interconnections are dispersed in comparison with a case where the currents flowing in the interconnections are concentrated. Therefore, it is considered that the array configuration of the resistance-change memory may be mainly made to suppress concentration of currents and reduce the potential drop.

FIG. 13 shows an example of the array configuration in which currents are dispersed. As shown in FIG. 13, the cell array is divided into plural arrays. This array is called a mat (MAT). That is, a chip 61 includes plural MATs 62. In each MAT 62, plural column gates 64b and sense amplifiers (S/A) 65b are connected to a cell array 63 with a capacity of 8 Mbits, 16 Mbits, 32 Mbits.

When the number of MATs 62 shown in FIG. 13 is 64, access is simultaneously made to 16 MATs, access is simultaneously made to 32 MATs or access is simultaneously made to 64 MATs at the time of access to the cell array 63. In the case of 16-bit access in each MAT, the total number of access cells in the whole chip is 16 bits×number of simultaneous access MATs. The total number of access cells is determined based on the permissible maximum current drawn and the performance.

Figure 14:
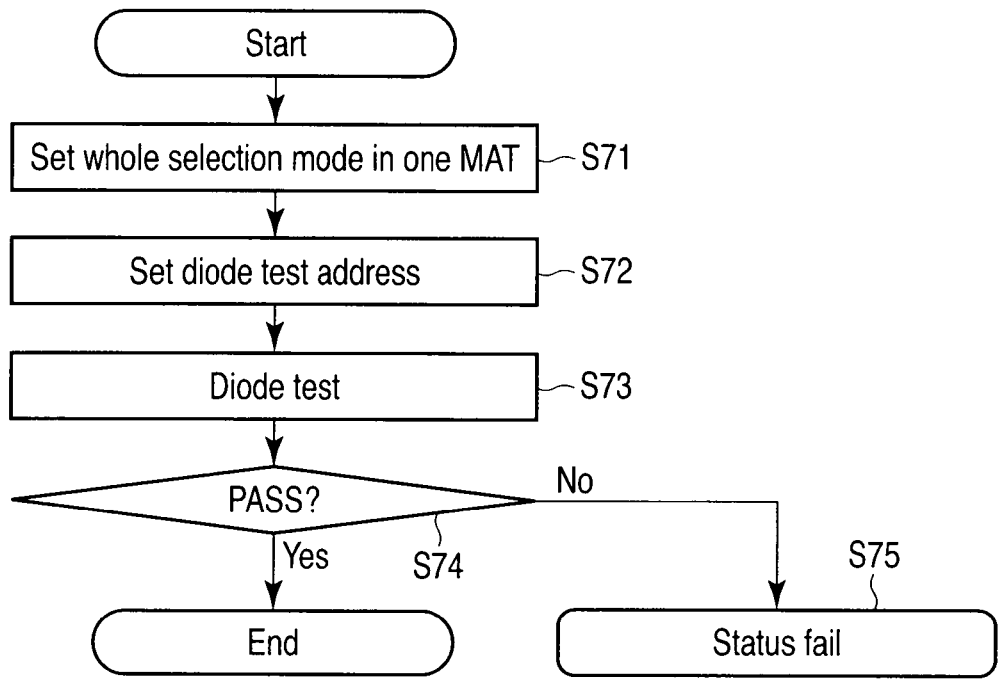
FIG. 14 is a flowchart showing a third embodiment.

FIG. 14 relates to a third embodiment and shows a case wherein the diode test is made in the above array configuration. In the normal access, a whole selection mode in which access is made to the entire mats is not used by taking the current drawn into consideration. Further, it is important to reduce the test time in a defective diode detecting process. However, it is necessary to perform a test with much attention paid to a change in the detection precision due to the fault occurrence frequency.

In FIG. 14, first, an in-MAT whole selection mode in which entire cells in one MAT are selected is set, for example (S71). Then, an address for the diode test is set (S72). Next, the diode test is made (S73) and the test result is determined (S74). In the diode test, a current flowing in one MAT is detected and the current is compared with a reference value. If the current larger than or equal to the reference value is detected as the result of comparison, it is determined that the diode is faulty and status data is transmitted as a fail to the external (S75). Further, if the current flowing in the MAT is detected to be less than the reference value as the result of comparison, the test for the MAT is terminated.

According to the third embodiment, the defective diode in each MAT can be detected when the memory cell array is configured by plural MATs 62. In addition, since the number of cells included in the MATs 62 is extremely smaller than the number of cells of the memory cell array in a case wherein the bit lines and word lines of the entire MATs are commonly connected without dividing them for each MAT, the diode can be tested in a short period of time while suppressing the current concentration.

The third embodiment is not limited to the case of FIG. 14 and the diode test can be made by accessing a small number of cells in the MAT in the entire MAT selection mode in which the entire MATs are selected, for example.

Further, in the example of FIG. 14, a defective diode can be specified by making the diode test with respect to the MAT in which status data indicates a fail.

Fourth Embodiment

Figure 15:
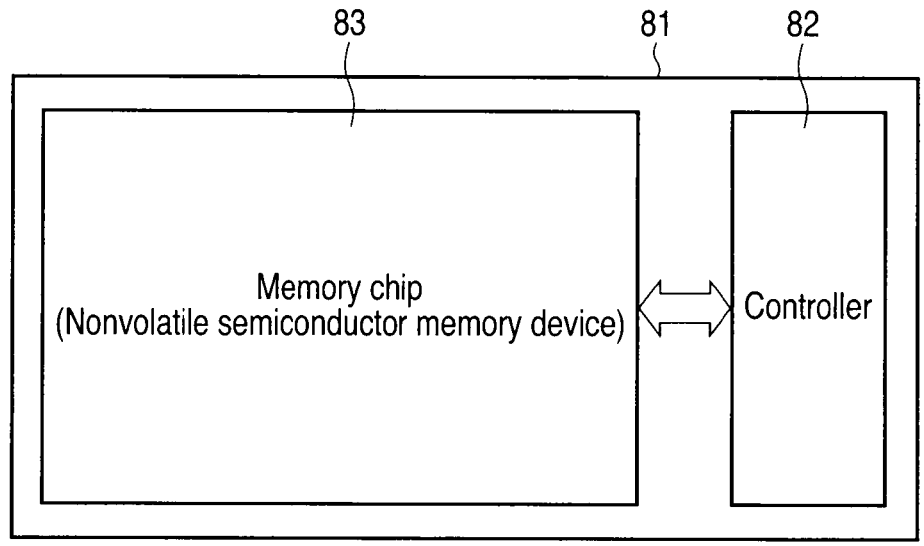
FIG. 15 is a configuration diagram showing a memory card applied to a fourth embodiment.
Figure 16:
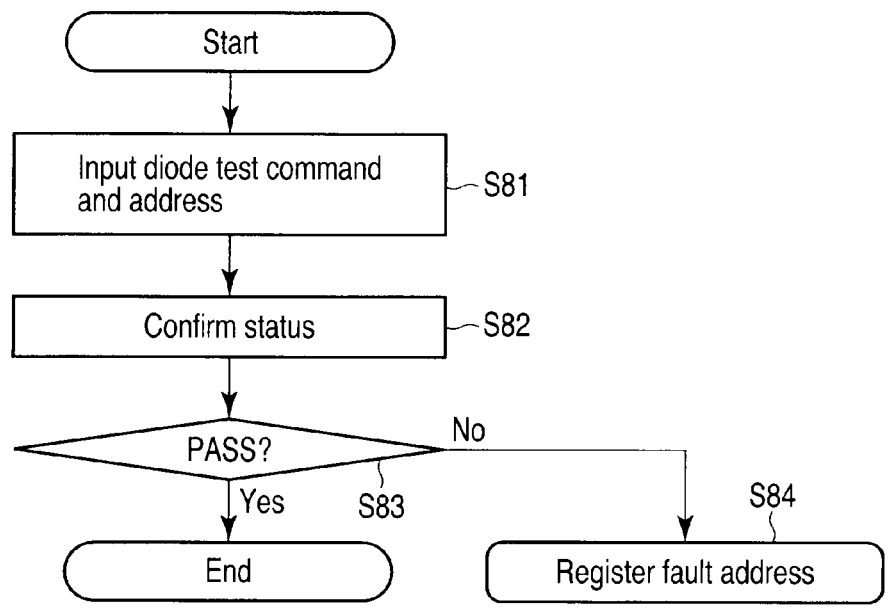
FIG. 16 is a flowchart showing a fourth embodiment.

FIGS. 15 and 16 show a fourth embodiment. The fourth embodiment shows an example in which a nonvolatile semiconductor memory device is applied to a memory card including a controller, for example.

That is, as shown in FIG. 15, a memory card 81 includes a controller 82 and a memory chip 83 of a nonvolatile semiconductor memory device 10. The controller 82 controls the basic operation such as the write, erase and read operations of the memory chip 83. Further, the controller 82 makes the above diode test.

In FIG. 16, first, a command and address used to make a diode test are supplied from the controller 82 to the memory chip 83 and the diode test is made in the memory chip 83 (S81). The result of the diode test is output from the memory chip 83 as status data and supplied to the controller 82. The controller 82 confirms the status data (S82, S83). When the status data indicates a fail, the controller 82 registers a fault address (S84) and inhibits the fault address from being used.

According to the fourth embodiment, in the memory card 81 including the controller 82, it is possible to detect a fault in the diode under the control of the controller 82. Therefore, it becomes possible to detect a fault in the diode not only at the die sort test time but also while the user uses the memory card after shipment.

In the fourth embodiment, a case where the nonvolatile semiconductor memory device 10 is applied to the memory card is explained, but this embodiment is not limited to the memory card and can of course be applied to another electronic device including a controller.

Fifth Embodiment

Figure 17:
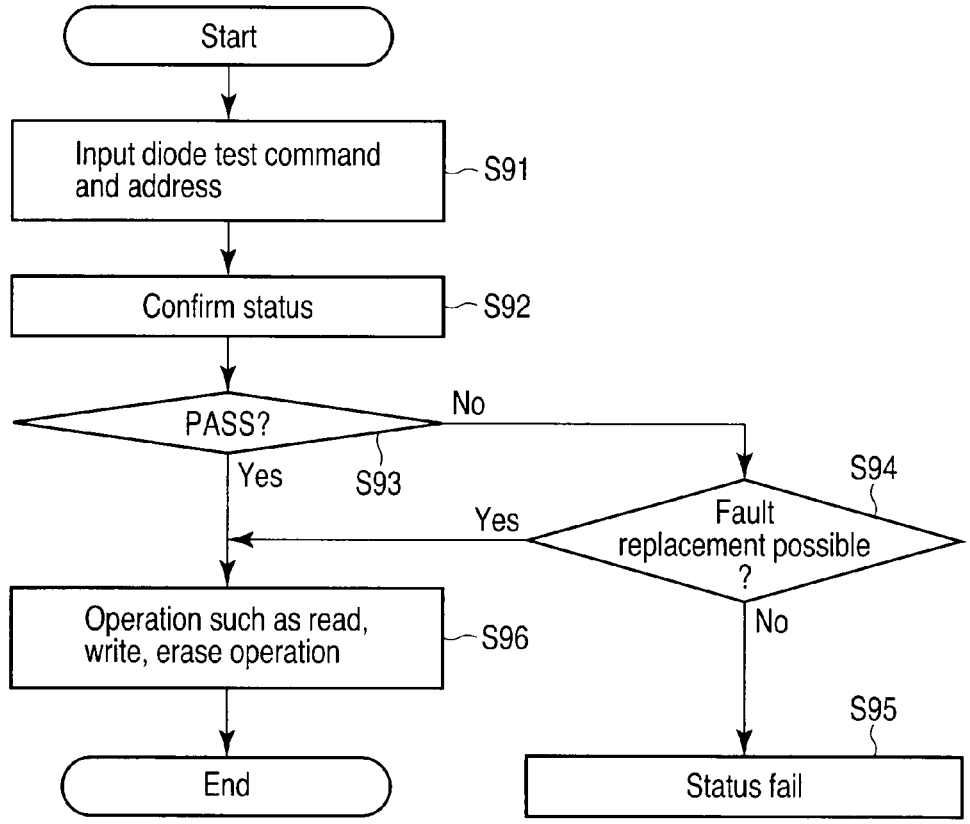
FIG. 17 is a flowchart showing a fifth embodiment.

FIG. 17 shows a fifth embodiment. Like the fourth embodiment, the fifth embodiment shows an example of a memory card including a controller and shows a sequence when a diode test is made before the basic operation such as write, erase and read operations is performed. Like the fourth embodiment, the fifth embodiment is not limited to a memory card.

In FIG. 17, a diode test is made in a memory chip 83 according to a command and address from a controller 82 and status data obtained as the result of the diode test is supplied to the controller 82 (S91 to S93). When the status data indicates a fail, the controller 82 determines whether or not a faulty cell can be replaced by a redundant cell based on a redundancy replacement function (S94). If it is detected that the replacement can be made as the result of this, the faulty cell is replaced by a redundant cell (S95). Then, the basic operation such as the write, erase and read operations is performed (S96). Further, if the replacement cannot be made, the status data is transmitted to the external as a fail (S95). If it is determined in step S93 that the status data indicates a pass, the basic operation such as the write, erase and read operations is performed (S96).

According to the fifth embodiment, the diode test is made before the basic operation such as the write, erase and read operations is performed. If a fault is detected in the diode as the result of this, whether the fault can be replaced or not is determined. If the replacement can be made, the faulty cell is replaced by a redundant cell. Therefore, the operation such as the write, erase and read operations can be correctly performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array having plural memory cells arranged in rows and columns and each including a diode and resistance-change element, and
   a control circuit that tests the diodes for the respective memory cells, the control circuit testing the diode at least at one of times before and after one of a write operation, erase operation and read operation with respect to the memory cell is performed.

2. The device according to claim 1, wherein the write operation, erase operation, read operation and diode test are contained in a die sort test.

3. The device according to claim 1, wherein the test is made by applying one of a forward bias voltage and reverse bias voltage to the respective memory cells.

4. The device according to claim 3, wherein the test is made by applying a positive voltage to a bit line connected to a selected one of the memory cells, applying 0 V to bit lines connected to unselected memory cells, applying 0 V to a word line connected to the selected memory cell and applying the positive voltage to word lines connected to the unselected memory cells when a forward bias voltage is applied to the respective memory cells.

5. The device according to claim 4, wherein the positive voltage is equal to half a forward voltage of the diode.

6. The device according to claim 3, wherein the test is made by applying 0 V to a bit line connected to a selected one of the memory cells, applying a positive voltage to bit lines connected to unselected memory cells and applying a positive voltage to a word line connected to the selected memory cell and word lines connected to the unselected memory cells when a reverse bias voltage is applied to the respective memory cells.

7. The device according to claim 3, wherein the test is made by applying 0 V to a bit line connected to a selected one of the memory cells and bit lines connected to unselected memory cells, applying a positive voltage to a word line connected to the selected memory cell and applying 0 V to word lines connected to the unselected memory cells when a reverse bias voltage is applied to the respective memory cells.

8. The device according to claim 1, wherein a portion of the memory cell array is used as a ROM fuse and a diode configuring the ROM fuse is tested after a read operation with respect to the ROM fuse is performed.

9. The device according to claim 1, further comprising a controller that controls the nonvolatile semiconductor memory device, the controller supplying a command used to test the diode to the nonvolatile semiconductor memory device before one of the write operation, erase operation and read operation is performed with respect to the memory cell.

10. A manufacturing method of a nonvolatile semiconductor memory device comprising:
preparing a memory cell array having plural memory cells arranged in rows and columns and each including a diode and resistance-change element, and
testing the diodes for the respective memory cells, the test being made at least at one of times before and after one of a write operation, erase operation and read operation is performed.

11. The method according to claim 10, wherein the write operation, erase operation, read operation and diode test are performed in a die sort test.

12. The method according to claim 10, wherein the test is made by applying one of a forward bias voltage and reverse bias voltage to the respective memory cells.

13. The method according to claim 12, wherein the test is made by applying a positive voltage to a bit line connected to a selected one of the memory cells, applying 0 V to bit lines connected to unselected memory cells, applying 0 V to a word line connected to the selected memory cell and applying the positive voltage to word lines connected to the unselected memory cells when a forward bias voltage is applied to the respective memory cells.

14. The method according to claim 13, wherein the positive voltage is equal to half a forward voltage of the diode.

15. The method according to claim 10, wherein the test is made by applying 0 V to a bit line connected to a selected one of the memory cells, applying a positive voltage to bit lines connected to unselected memory cells and applying a positive voltage to a word line connected to the selected memory cell and word lines connected to the unselected memory cells when a reverse bias voltage is applied to the respective memory cells.

16. The method according to claim 10, wherein the test is made by applying 0 V to a bit line connected to a selected one of the memory cells and bit lines connected to unselected memory cells, applying a positive voltage to a word line connected to the selected memory cell and applying 0 V to word lines connected to the unselected memory cells when a reverse bias voltage is applied to the respective memory cells.

17. The method according to claim 10, wherein the memory cell array is divided into plural mats and the diodes of at least one of the mats are simultaneously tested.

18. The method according to claim 10, further comprising supplying a command and address used to test the diode to a memory chip including the memory cell array from a controller, making a test for the diode in the memory chip, and permitting the controller to receive status data output from the memory chip, the controller registering a fault address when the status data indicates a fault.

19. The method according to claim 10, further comprising supplying a command and address used to test the diode to a memory chip including the memory cell array from a controller, making a test for the diode in the memory chip, permitting the controller to receive status data output from the memory chip, the controller determining whether a faulty cell is replaceable by a redundant cell when the status data indicates a fault, and replacing the faulty cell by a redundant cell when it is detected that replacement is possible as a result of determination.

* * * * *